(12) United States Patent
Seong

(10) Patent No.: US 10,354,702 B2
(45) Date of Patent: Jul. 16, 2019

(54) SEMICONDUCTOR MEMORY DEVICE WITH A CONTROL LOGIC CAPABLE OF CONTROLLING THE READY BUSY OUTPUT CONTROL UNIT TO ADJUST AN OUTPUT CURRENT TO BE OUTPUTTED TO A READY/BUSY PAD, AND A METHOD FOR OPERATING THE SAME

(71) Applicant: SK hynix Inc., Gyeonggi-do (KR)

(72) Inventor: Jin Yong Seong, Seoul (KR)

(73) Assignee: SK hynix Inc., Geyonggi-do (KR)

( * ) Notice: Subject to any disclaimer, the term of this patent is extended or adjusted under 35 U.S.C. 154(b) by 0 days.

(21) Appl. No.: 15/632,591

(22) Filed: Jun. 26, 2017

(65) Prior Publication Data
US 2018/0108389 A1 Apr. 19, 2018

(30) Foreign Application Priority Data
Oct. 17, 2016 (KR) .................. 10-2016-0134334

(51) Int. Cl.
*G11C 7/10* (2006.01)
*G11C 11/56* (2006.01)
*G11C 16/04* (2006.01)
*G11C 16/34* (2006.01)
*G11C 16/32* (2006.01)

(52) U.S. Cl.
CPC .......... *G11C 7/1093* (2013.01); *G11C 7/1051* (2013.01); *G11C 7/1063* (2013.01); *G11C 11/5621* (2013.01); *G11C 11/5628* (2013.01); *G11C 11/5635* (2013.01); *G11C 16/0483* (2013.01); *G11C 16/32* (2013.01); *G11C 16/3404* (2013.01)

(58) Field of Classification Search
CPC ...... G11C 7/1093; G11C 16/32; G11C 7/1063
See application file for complete search history.

(56) References Cited

U.S. PATENT DOCUMENTS

| 5,224,070 | A * | 6/1993 | Fandrich | G11C 16/10 365/185.04 |
| 6,253,259 | B1 * | 6/2001 | Hirabayashi | G06F 13/4291 709/217 |
| 9,424,901 | B1 * | 8/2016 | An | G11C 7/227 |
| 2005/0268025 | A1 * | 12/2005 | Smith | G11C 16/10 711/103 |

(Continued)

FOREIGN PATENT DOCUMENTS

| KR | 101182597 | 9/2012 |
| KR | 101382563 | 4/2014 |

OTHER PUBLICATIONS

Norris et al. ("Understanding Current Output Digital to Analog Converters", Intersil, Application Notes, Jun. 1999).*

*Primary Examiner* — Mushfique Siddique
(74) *Attorney, Agent, or Firm* — IP & T Group LLP

(57) ABSTRACT

A semiconductor memory device includes a memory cell array, a status signal generator, an RB output control unit and a control logic. The memory cell array includes a plurality of memory cells. The status signal generator outputs an internal status signal indicating whether the memory cell array is performing an internal operation. The RB output control unit outputs a ready/busy signal based on the internal status signal. The control logic controls the RB output control unit to adjust an output current of the RB output control unit.

14 Claims, 12 Drawing Sheets

(56) References Cited

U.S. PATENT DOCUMENTS

| | | | |
|---|---|---|---|
| 2009/0144484 A1* | 6/2009 | Sukegawa | G06F 1/3225 |
| | | | 711/100 |
| 2010/0149858 A1* | 6/2010 | Abdulla | G11C 7/1051 |
| | | | 365/163 |
| 2011/0006349 A1* | 1/2011 | Ota | H01L 21/26586 |
| | | | 257/288 |
| 2011/0264846 A1* | 10/2011 | Oh | G11C 7/1051 |
| | | | 711/103 |
| 2014/0204684 A1* | 7/2014 | Kwak | G11C 7/10 |
| | | | 365/189.05 |
| 2015/0143155 A1* | 5/2015 | Cho | G11C 5/066 |
| | | | 713/401 |
| 2016/0246514 A1* | 8/2016 | Nosaka | G06F 3/0611 |
| 2018/0061462 A1* | 3/2018 | Murakami | G11C 7/1063 |

\* cited by examiner

SEMICONDUCTOR MEMORY DEVICE WITH A CONTROL LOGIC CAPABLE OF CONTROLLING THE READY BUSY OUTPUT CONTROL UNIT TO ADJUST AN OUTPUT CURRENT TO BE OUTPUTTED TO A READY/BUSY PAD, AND A METHOD FOR OPERATING THE SAME

CROSS-REFERENCE TO RELATED APPLICATION

The present application claims priority under 35 U.S.C. § 119(a) to Korean patent application number 10-2016-0134334, filed on Oct. 17, 2016, the entire disclosure of which is incorporated herein by reference in its entirety.

BACKGROUND

Field of Invention

Various embodiments of the present disclosure relate to an electronic device, and more particularly, to a semiconductor memory device and a method for operating the semiconductor memory device.

Description of Related Art

Semiconductor memory devices are memory devices realized using a semiconductor such as silicon (Si), germanium (Ge), gallium arsenide (GaAs), indium phosphide (InP), or the like. Semiconductor memory devices are classified into volatile memory devices and nonvolatile memory devices.

The volatile memory device is a memory device in which data stored therein is lost when power is turned off. Examples of the volatile memory device include a static RAM (SRAM), a dynamic RAM (DRAM), a synchronous DRAM (SDRAM), etc. The nonvolatile memory device is a memory device in which data stored therein is maintained even when power is turned off. Examples of the nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type memory and a NAND type memory.

SUMMARY

Various embodiments of the present disclosure are directed to a semiconductor memory device capable of controlling a current to be outputted to a ready/busy pad, and a method for operating the same.

One embodiment of the present disclosure provides a semiconductor memory device including: a memory cell array including a plurality of memory cells; a status signal generator suitable for outputting an internal status signal indicating whether the memory cell array is performing an internal operation; an RB output control unit suitable for outputting a ready/busy signal based on the internal status signal; and a control logic suitable for controlling the RB output control unit to adjust an output current of the RB output control unit.

The RB output control unit may include: an RB signal receiving unit suitable for receiving the internal status signal, receiving an output control signal from the control logic, and outputting an internal ready/busy signal; and an RB output unit suitable for outputting the ready/busy signal based on the internal ready/busy signal, and adjusting the output current based on the output control signal.

The RB signal receiving unit may include: a signal transmission unit suitable for transmitting the internal status signal; and a plurality of internal signal output units each suitable for selectively outputting the internal status signal based on the output control signal, and generating the internal ready/busy signal.

The signal transmission unit may include an inverter.

The signal transmission unit may include a NOR gate.

The NOR gate may output a result of a NOR operation between the internal status signal and the corresponding output control signal.

Each of the internal signal output units may include an AND gate suitable for performing an AND operation between the internal status signal outputted from the signal transmission unit and the corresponding output control signal, and outputting a result of the AND operation as the internal ready/busy signal.

The RB output unit may include: a plurality of output drive units each selectively turned on based on the internal ready/busy signal, and suitable for outputting the ready/busy signal.

Each of the output drive units may be coupled to a ready/busy pad, and the RB output unit adjusts the output current depending on a number of turned-on output drive units among the plurality of output drive units.

The output drive unit may include: a transistor coupled to a supply voltage and suitable for receiving the internal ready/busy signal through a gate electrode thereof; and a resistor coupled between the transistor and the ready/busy pad.

Another embodiment of the present disclosure provides a method for operating a semiconductor memory device, including: receiving an internal status signal indicating whether a memory cell array is performing an internal operation; receiving an output control signal which is generated to adjust an output current flowing to an output terminal; and selectively turning on a plurality of output drive units each suitable for outputting the internal status signal as a ready/busy signal, based on the output control signal.

The selectively turning on of the plurality of output drive units may include: generating an internal ready/busy signal by selectively outputting the internal status signal based on the output control signal; and receiving the internal ready/busy signal and selectively turning on transistors included in the respective output drive units.

The generating of the internal ready/busy signal may include: logically-inverting the internal status signal; and generating the internal ready/busy signal by performing an AND operation between the logically-inverted internal status signal and the output control signal.

The generating of the internal ready/busy signal may include: performing a NOR operation between the internal status signal and a zeroth output control signal; and generating the internal ready/busy signal by performing an AND operation between a result of the NOR operation and a first output control signal, wherein the zeroth output control signal and the first output control signal may be included in the output control signal.

The output current may be adjusted depending on a number of turned-on output drive units among the plurality of output drive units.

The output current flowing to an output terminal may be adjusted by selectively turning on the transistors included in the respective output drive units.

BRIEF DESCRIPTION OF THE DRAWINGS

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
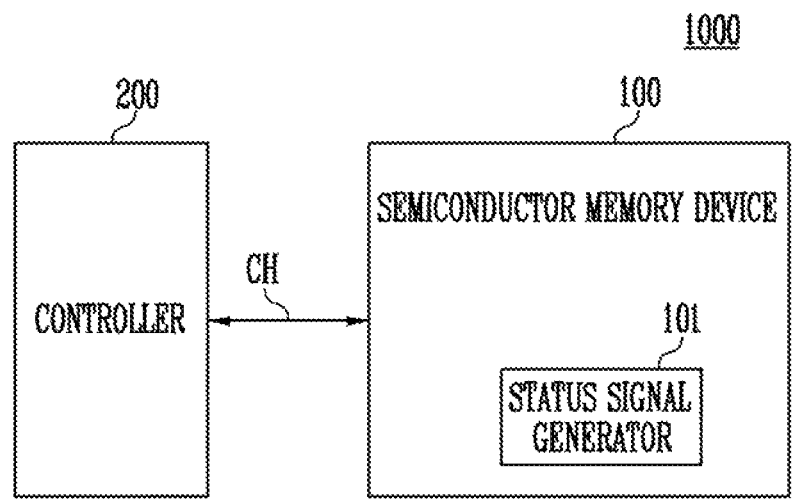
FIG. 1 is a block diagram illustrating a memory system including a semiconductor memory device and a controller.

Hereinafter, embodiments will be described in greater detail with reference to the accompanying drawings. Embodiments are described herein with reference to cross-sectional illustrations that are schematic illustrations of embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but those terms should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "Including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Figure 2:
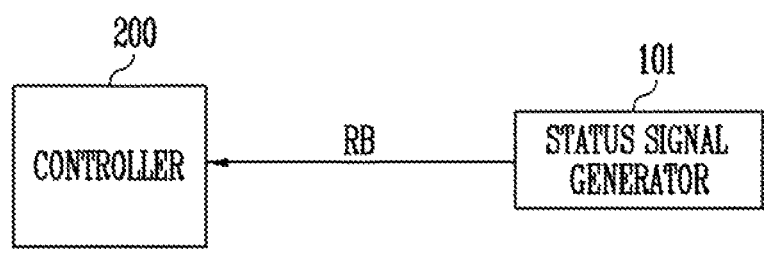
FIG. 2 is a diagram illustrating an embodiment of a status signal that is communicated between a status signal generator and the controller of FIG. 1.
Figure 3:
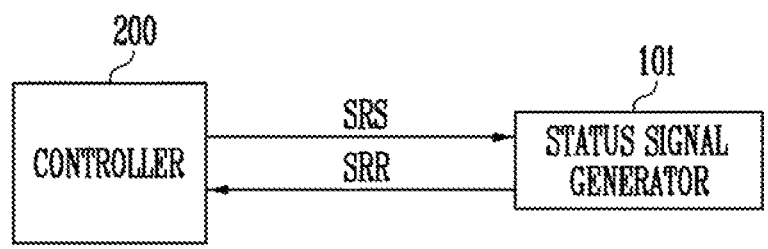
FIG. 3 is a diagram illustrating another embodiment of a status signal that is communicated between the status signal generator and the controller of FIG. 1.

FIG. 1 is a block diagram illustrating a semiconductor memory device 100 and a memory system 1000 including a controller 200. FIG. 2 is a diagram illustrating an embodiment of a status signal communicated between a status signal generator 101 and the controller 200. FIG. 3 is a diagram illustrating another embodiment of a status signal communicated between the status signal generator 101 and the controller 200.

Referring FIG. 1, the memory system 1000 includes a semiconductor memory device 100 and a controller 200.

The semiconductor memory device 100 is operated under the control of the controller 200. The semiconductor memory device 100 includes a memory cell array including a plurality of memory blocks. In an embodiment, the semiconductor memory device 100 may be a flash memory device.

The semiconductor memory device 100 is configured to receive a command and an address from the controller 200 through a channel CH and to access an area selected by the address in the memory cell array. That is, the semiconductor memory device 100 performs an internal operation to the area selected by the address in response to the command.

For example, the semiconductor memory device 100 may perform a program operation, a read operation, and an erase operation. During a program operation, the semiconductor memory device 10 may program data in the area selected by the address. During a read operation, the semiconductor memory device 100 may read data from the area selected by the address. During an erase operation, the semiconductor memory device 10 may erase data stored in the area selected by the address.

The semiconductor memory device 100 includes a status signal generator 101. The status signal generator 101 outputs a status signal indicating whether the semiconductor memory device 100 is in a ready state or in a busy state.

The words "the semiconductor memory device 100 is in a ready state" may mean that the semiconductor memory device 100 has completed an internal operation and then stands by. For example, the words "the semiconductor memory device 100 is in the ready state" may mean that the semiconductor memory device 100 has completed a program operation, a read operation or an erase operation corresponding to the command.

The words "the semiconductor memory device 100 is in a busy state" may mean that the semiconductor memory device 100 still performs an internal operation. For example, the words "the semiconductor memory device 100 is in the busy state" may mean that the semiconductor memory device 100 still performs a program operation, a read operation or an erase operation corresponding to the command.

In an embodiment, as shown in FIG. 2, the status signal generator 101 may output a ready/busy signal RB as the status signal. The status signal generator 101 is coupled to the controller 200 through a ready/busy line (not shown) distinct from the channel CH, and outputs the ready/busy signal RB through the ready/busy line. For example, the ready/busy signal RB is disabled to a logic 'high' level to represent that the semiconductor memory device 100 in a ready state, and the ready/busy signal RB is enabled to a logic 'low' level to represent that the semiconductor memory device 100 in a busy state.

In an embodiment, as shown in FIG. 3, the status signal generator 101 may output a status read response signal SRR as a status signal. The controller 200 may transmit a status read signal SRS to the semiconductor memory device 100 through the channel CH, and the status signal generator 101 may transmit a status read response signal SRR to the controller 200 through the channel CH in response to the status read signal SRS. For example, the status read response signal SRR is a first state value which represents the semiconductor memory device 100 in a ready state. The status read response signal SRR is a second state value which represents the semiconductor memory device 100 in a busy sate.

When the status signal indicates a ready state, the controller 200 may transmit a subsequent command to the semiconductor memory device 100.

Referring again to FIG. 1, the controller 200 controls the semiconductor memory device 100 through the channel CH. The controller 200 may provide a command to the semiconductor memory device 100 in response to a request from a host (not shown). When the status signal indicates a ready state, the controller 200 may command the semiconductor memory device 100 to perform a specific operation. When the status signal indicates a busy state, the controller 200 may wait for the status signal to indicate a ready state, and then may provide a command to the semiconductor memory device 100 according to the status signal indicating a ready state.

In an embodiment, the controller 200 may control the semiconductor memory device 100 so that a program operation, a read operation or an erase operation is performed. During a program operation, the controller 200 may provide a program command, an address, and data to the semiconductor memory device 100 through the channel CH. During a read operation, the controller 200 may provide a read command and an address to the semiconductor memory device 100 through the channel CH. During an erase operation, the controller 200 may provide an erase command and an address to the semiconductor memory device 100 through the channel CH.

In an embodiment, the controller 200 may include components, such as a Random Access Memory (RAM), a processing unit, a host interface, and a memory interface. The RAM is used as at least one of a work memory of the processing unit, a cache memory between the semiconductor memory device 100 and the host, and a buffer memory between the semiconductor memory device 100 and the host. The processing unit controls the overall operation of the controller 200.

The host interface 1630 may include a protocol for performing data exchange between the host and the controller 200. In an embodiment, the controller 200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

As the manufacturing process is highly developed, the semiconductor memory device includes a larger number of memory chips. In the semiconductor memory device including a large number of memory chips, a ready/busy pad is physically coupled to the controller 200 to output a ready/busy signal RB in the same manner as that shown in FIG. 2. With regard to this structure, when a ready/busy signal RB or a status read response signal SRR is outputted in the same manner as that shown in FIG. 2 or 3, the output current is increased as the amount of integrated memory chips is increased. As the output current needed for outputting the ready/busy signal RB is increased, the required operating power of the semiconductor memory device is increased. In the semiconductor memory device in accordance with an embodiment of the present disclosure, since the output current needed for outputting the ready/busy signal may be controlled, the required operating power of the semiconductor memory device may be reduced.

Figure 4:
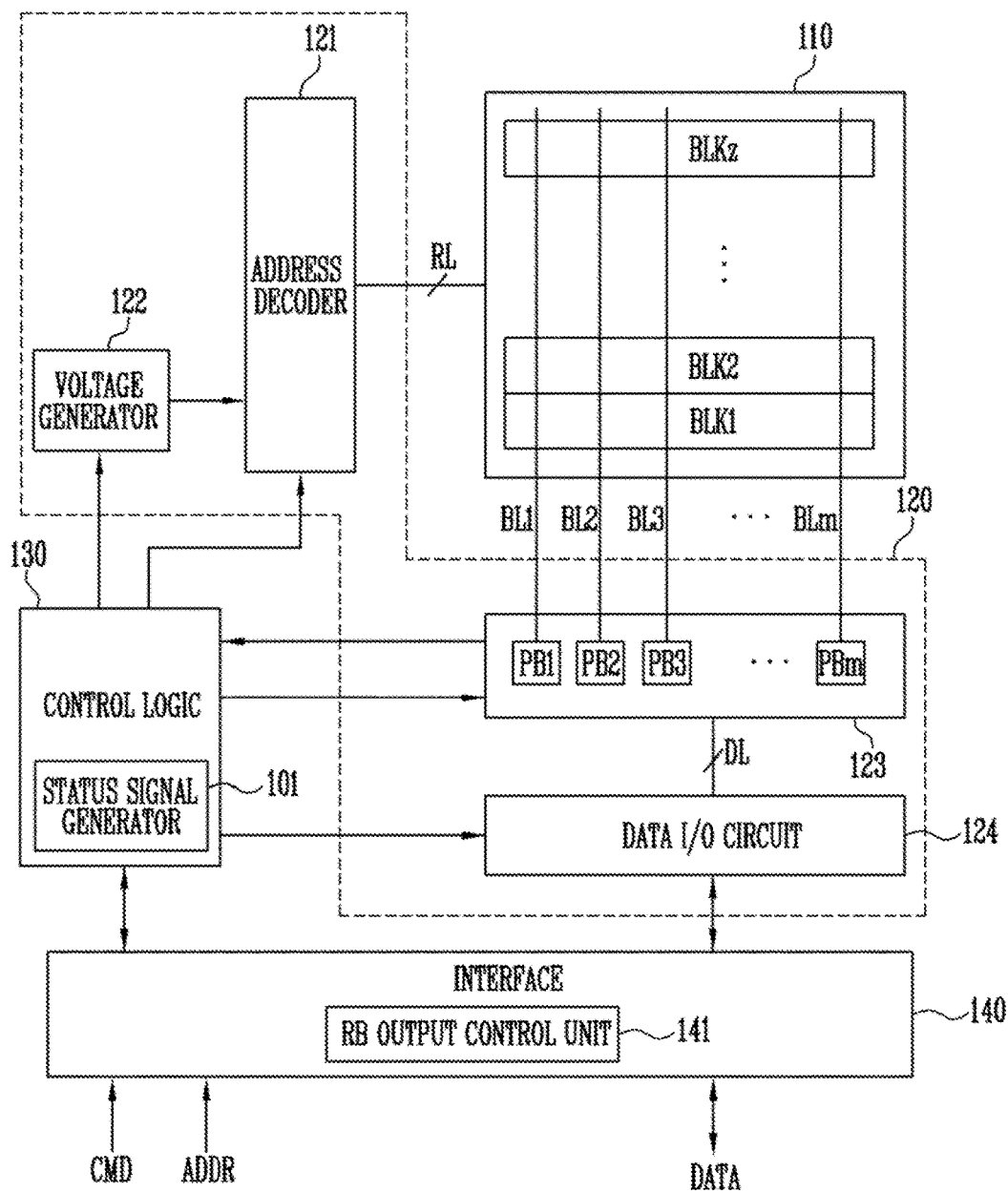
FIG. 4 is a block diagram illustrating the structure of the semiconductor memory device of FIG. 1.

FIG. 4 is a block diagram illustrating the configuration of the semiconductor memory device 100 of FIG. 1.

Figure 5:
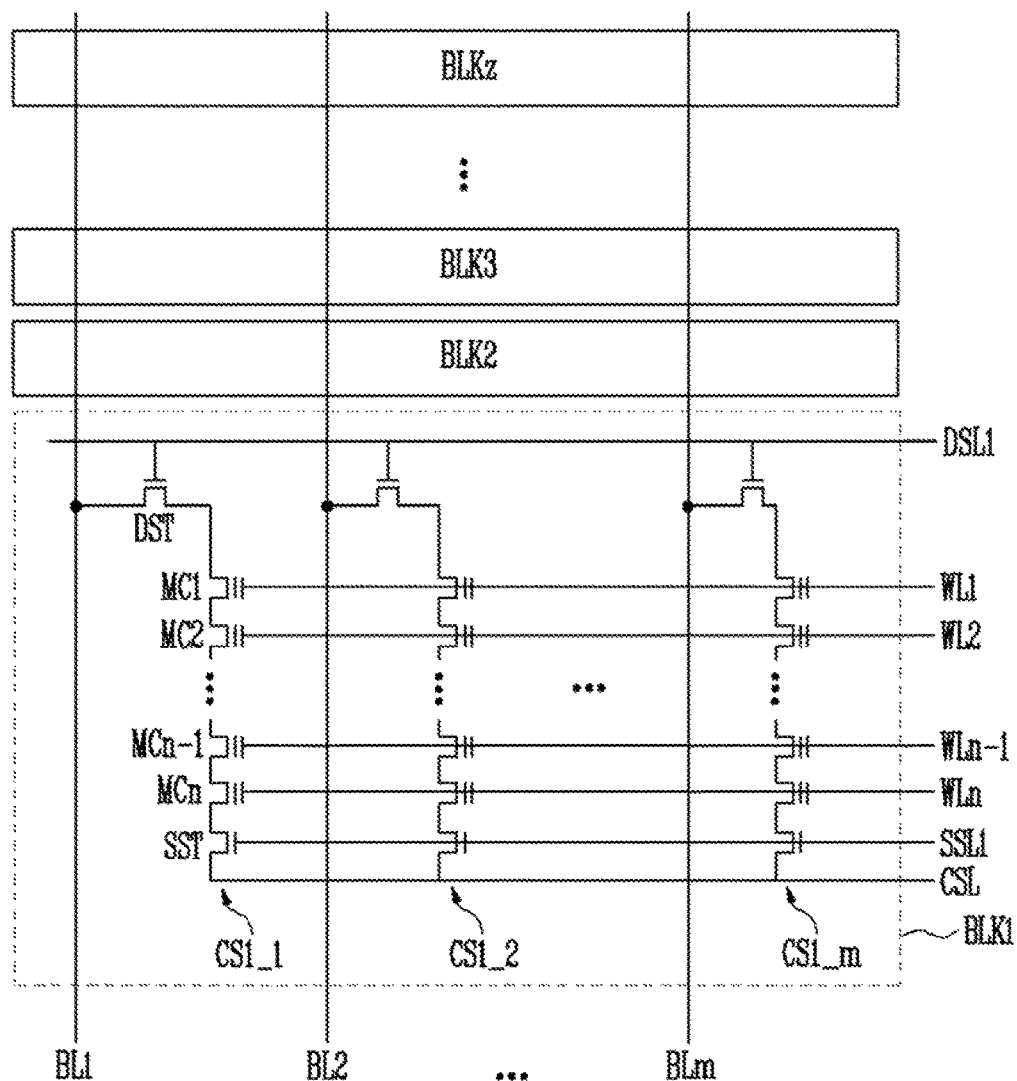
FIG. 5 is a diagram illustrating an embodiment of the memory cell array of FIG. 4.

FIG. 5 is a diagram illustrating an embodiment of the memory cell array 110_1 of FIG. 4.

Referring to FIG. 4, the semiconductor memory device 100 may include a memory cell array 110, a peripheral circuit 120, a control logic 130 and an interface 140.

The memory cell array 110 may be coupled to an address decoder 121 through source select lines SSL, word lines WL, and drain select lines DSL and may be coupled to a read/write circuit 123 through bit lines BL.

The memory cell array 100 includes a plurality of memory blocks BLK1 to BLKz. The plurality of memory blocks BLK1 to BLKz are coupled to the address decoder 121 through row lines RL. The memory blocks BLK1 to BLKz are coupled to the read/write circuit 123 through the bit lines BL1 to BLm. Each of the memory blocks BLK1 to BLKz includes a plurality of memory cells. In an embodiment, the plurality of memory cells may be nonvolatile memory cells. Memory cells coupled to the same word line among the plurality of memory cells are defined as one page. That is, the memory cell array 100 is formed of a plurality of pages.

Each of the memory cells of the memory cell array 1000 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array 110_1 of FIG. 5 illustrates an embodiment of the memory cell array 110 of FIG. 4.

Referring to FIG. 5, first to z-th memory blocks BLK1 to BLKz included in the memory cell array 100_1 are coupled in common to first to m-th bit lines BL1 to BLm. In FIG. 5, elements of only the first memory block BLK1 among the plurality of memory blocks BLK1 to BLKz are illustrated, and illustration of elements of each of the other memory blocks BLK2 to BLKz is omitted. It will be understood that each of the memory blocks BLK2 to BLKz has the same configuration as that of the first memory block BLK1.

The memory block BLK1 includes a plurality of cell strings CS1_1 to CS1_m. The first to m-th cell strings CS1_1 to CS1_m are respectively coupled to the first to m-th bit lines BL1 to BLm.

Each of the first to m-th cell strings CS1_1 to CS1_m includes a drain select transistor DST, a plurality of memory cells MC1 to MCn which are coupled in series to each other, and a source select transistor SST. The drain select transistor DST is coupled to a drain select line DSL1. The first to n-th memory cells MC1 to MCn are respectively coupled to first to n-th word lines WL1 to WLn. The source select transistor SST is coupled to a source select line SSL1. A drain of the drain select transistor DST is coupled to the corresponding bit line. The drain select transistors DST of the first to m-th cell strings CS1_1 to CS1_m are respectively coupled to the first to m-th bit lines BL1 to BLm. A source of the source select transistor SST is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 4. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read/write circuit 123.

Referring again to FIG. 4, the peripheral circuit 120 may include the address decoder 121, the voltage generator 122, the read/write circuit 123, and the data input/output circuit 124.

The peripheral circuit 120 drives the memory cell array 110. For example, the peripheral circuit 120 may drive the memory cell array 110 so that a program operation, a read operation, and an erase operation are performed.

The address decoder 121 is coupled to the memory cell array 100 through the row lines RL. The address decoder 121 is configured to operate under the control of the control logic 130. The address decoder 121 receives an address ADDR from the control logic 130 through an input/output buffer (not shown) included in the semiconductor memory device 100.

The address decoder 121 is configured to decode a block address among the received addresses ADDR. The address decoder 121 selects a corresponding one of the memory blocks BLK1 to BLKz in response to the decoded block address. The address decoder 121 is configured to decode a row address among the received addresses ADDR. The address decoder 121 may select at least one word line of the selected memory block by applying voltages supplied from the voltage generator 122 to at least one word line WL in response to the decoded row address.

During a program operation, the address decoder 121 may apply a program voltage to the selected word line and apply a pass voltage having a lower level than that of the program voltage to unselected word lines. During a program verify operation, the address decoder 121 may apply a verification voltage to a selected word line and apply a verification pass voltage higher than the verification voltage to unselected word lines.

During a read operation, the address decoder 121 may apply a read voltage to a selected word line and apply a pass voltage higher than the read voltage to unselected word lines.

In an embodiment, an erase operation of the semiconductor memory device 100 is performed on a memory block basis. During an erase operation, the address ADDR inputted to the semiconductor memory device 100 includes a block address. The address decoder 121 may decode the block address and select a corresponding one memory block in response to the decoded block address. During an erase operation, the address decoder 121 may apply a ground voltage to a word line coupled to the selected memory block.

In an embodiment, the address decoder 121 may be configured to decode a column address among the received addresses ADDR. A decoded column address DCA may be transmitted to the read/write circuit 123. In an exemplary embodiment, the address decoder 121 may include components such as a row decoder, a column decoder, and an address buffer.

The voltage generator 122 is configured to generate a plurality of voltages using an external supply voltage provided to the semiconductor memory device 100. The voltage generator 122 is operated under the control of the control logic 130.

In an embodiment, the voltage generator 122 may produce an internal supply voltage by regulating the external supply voltage. The Internal supply voltage generated by the voltage generator 122 is used as an operating voltage for the semiconductor memory device 100.

In an embodiment, the voltage generator 122 may generate a plurality of voltages using the external supply voltage or the internal supply voltage. The voltage generator 122 may be configured to generate various voltages required by the semiconductor memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal supply voltage and generate a plurality of voltages by selectively enabling the plurality of pumping capacitors under the control of the control logic 130.

The generated voltages may be supplied to the memory cell array 110 by the address decoder 121.

The read/write circuit 123 includes first to m-th page buffers PB1 to PBm. The first to m-th page buffers PB1 to PBm are coupled to the memory cell array 100 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA, received through the data I/O circuit 124, to selected memory cells through the bit lines BL1 to BLm when a program pulse is applied to each selected word line. The memory cells in the selected page are programmed based on the transmitted data DATA. Memory cells coupled to a bit line to which a program permission voltage for example, a ground voltage is applied may have increased threshold voltages. Threshold voltages of memory cells coupled to a bit line to which a program inhibit voltage for example, a supply voltage is applied, may be maintained. During a program verify operation, the first to m-th page buffers PB1 to PBm read page data from selected memory cells through the bit lines BL1 to BLm.

During a read operation, the read/write circuit 123 reads data DATA from the memory cells in the selected page through the bit lines BL, and outputs the read data DATA to the data input/output circuit 124.

During an erase operation, the read/write circuit 123 may float the bit lines BL. In an embodiment, the read/write circuit 123 may include a column select circuit.

The data input/output circuit 124 is coupled to the first to m-th page buffers PB1 to PBm through the data lines DL. The data input/output circuit 124 is operated under the control of the control logic 130. During a program operation, the data input/output circuit 124 receives data DATA to be stored from an external controller (not shown). During a read operation, the data input/output circuit 124 outputs the data, received from the first to m-th page buffers PB1 to PBm included in the read/write circuit 123, to the external controller.

The control logic 130 may be coupled to the address decoder 121, the voltage generator 122, the read/write circuit 123, and the data input/output circuit 124. The control logic 130 may be configured to control the overall operation of the semiconductor memory device 100. The control logic 130 may be operated in response to a command CMD transmitted from an external device.

The control logic 130 may further include a status signal generator 101. The control logic 130 may control the output of the status signal generator 101 depending on whether an operation corresponding to the command received from the external device is being performed.

The status signal generator 101 outputs an internal status signal indicating whether the semiconductor memory device 100 is in a ready state or in a busy state. For example, the status signal generator 101 may output an internal status signal to the interface 140. The interface 140 may output any one of a ready signal and a busy signal through a ready/busy line depending on the received internal status signal.

The words "the semiconductor memory device 100 is in a ready state" may mean that the semiconductor memory device 100 has completed an internal operation and then stands by. For example, the words "the semiconductor memory device 100 is in the ready state" may mean that the semiconductor memory device 100 has completed a program operation, a read operation or an erase operation corresponding to the command.

The words "the semiconductor memory device 100 is in a busy state" may mean that the semiconductor memory device 100 still performs an internal operation. For example, the words "the semiconductor memory device 100 is in the busy state" may mean that the semiconductor memory device 100 still performs a program operation, a read operation or an erase operation corresponding to the command.

The interface 140 may interface data communication between the semiconductor memory device 100 and the external device. The Interface may include a NAND interface or a NOR interface depending on the type of semiconductor memory device 100.

In accordance with an embodiment of the present disclosure, the interface 140 may include an RB output control unit 141. The RB output control unit 141 may output an internal status signal, which is provided from the status signal generator 101, as a ready/busy signal, and control output current flowing through the output terminal. For this, the RB output control unit 141 may include an RB signal receiving unit and an RB output unit. Detailed configurations and operations of the RB signal receiving unit and the RB output unit included in the RB output control unit 141 will be described later herein with reference to FIGS. 9 to 17.

The interface 140 may receive an internal status signal from the status signal generator 101 included in the control logic 130 and then output a ready/busy signal through the ready/busy line. The words "the ready/busy signal RB is disabled to a logic 'high' level" may mean that the semiconductor memory device 100 is in a ready state, and the words "the ready/busy signal RB is enabled to a logic 'low' level" may mean that the semiconductor memory device 100 is in a busy state. In another example, the words "the output terminal of the ready/busy signal has high impedance" may mean that the semiconductor memory device 100 is in a ready state, and the words "the output terminal of the ready/busy signal has low impedance" may mean that the semiconductor memory device 100 is in a busy state. In FIG. 4, the status signal generator 101 has been illustrated as being included in the control logic 130, but depending on embodiments, the semiconductor memory device 100 may include a status signal generator which is disposed separately from the control logic 130.

According to an embodiment of the present disclosure, the status signal generator 101 generates an internal status signal and outputs it to the RB output control unit 141. The internal status signal is a signal indicating whether the memory cell array 110 is performing an internal operation. The RB output control unit 141 outputs a ready/busy signal RB based on the internal status signal. In this case, the control logic 130 may control the RB output control unit 141 such that the output current of the RB output control unit 141 is adjusted. That is, the control logic 130 may generate an output control signal for adjusting the output current of the RB output control unit 141. The RB output control unit 141 may output a ready/busy signal, and adjust the output current of the output terminal in response to the output control signal.

Figure 6:
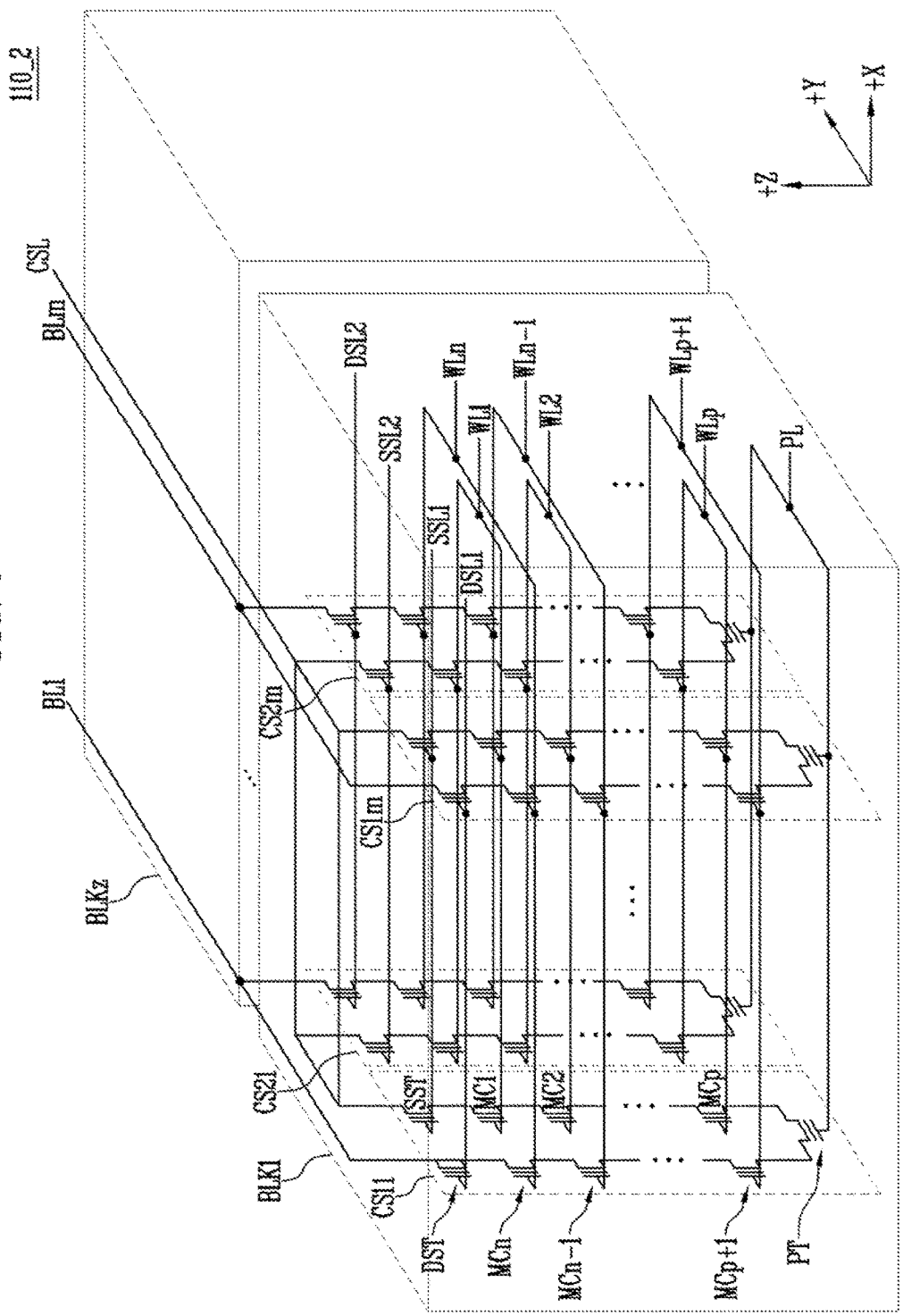
FIG. 6 is a diagram illustrating another embodiment of the memory cell array of FIG. 4.

FIG. 6 is a diagram illustrating another embodiment of the memory cell array 110 of FIG. 4.

Referring to FIG. 6, a memory cell array 110_2 includes a plurality of memory blocks BLK1 to BLKz. In FIG. 6, the internal configuration of the first memory block BLK1 is illustrated, and the internal configuration of the other memory blocks BLK2 to BLKz is omitted. It will be understood that each of the second to z-th memory blocks BLK2 to BLKz has the same configuration as that of the first memory block BLK1.

Referring to FIG. 6, the first memory block BLK1 includes a plurality of cell strings CS11 to CS1m and CS21 to CS2m. In an embodiment, each of the cell strings CS11 to CS1m and CS21 to CS2m may be formed in a 'U' shape. In the first memory block BLK1, m cell strings are arranged in a row direction that is, a positive (+) X direction. In FIG. 6, two cell strings are shown as being arranged in a column direction that is, a positive (+) Y direction. However, this Illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 6, source select transistors of cell strings CS11 to CS1m in a first row are coupled to a first source select line SSL1. Source select transistors of cell strings CS21 to CS2m in a second row are coupled to a second source select line SSL2.

In another embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to a positive (+) Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding cell string may be stably controlled. Thereby, the reliability of data stored in the memory block BLK1 is improved.

The gates of the respective pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction are coupled to bit lines extending in the column direction. In FIG. 4, cell strings CS11 and CS21 In a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. Cell strings arranged in the direction of a single row may be selected by selecting any one of the drain select lines DSL1 and DSL2. A single page may be selected from the selected cell strings by selecting any one of the word lines WL1 to WLn.

Figure 7:
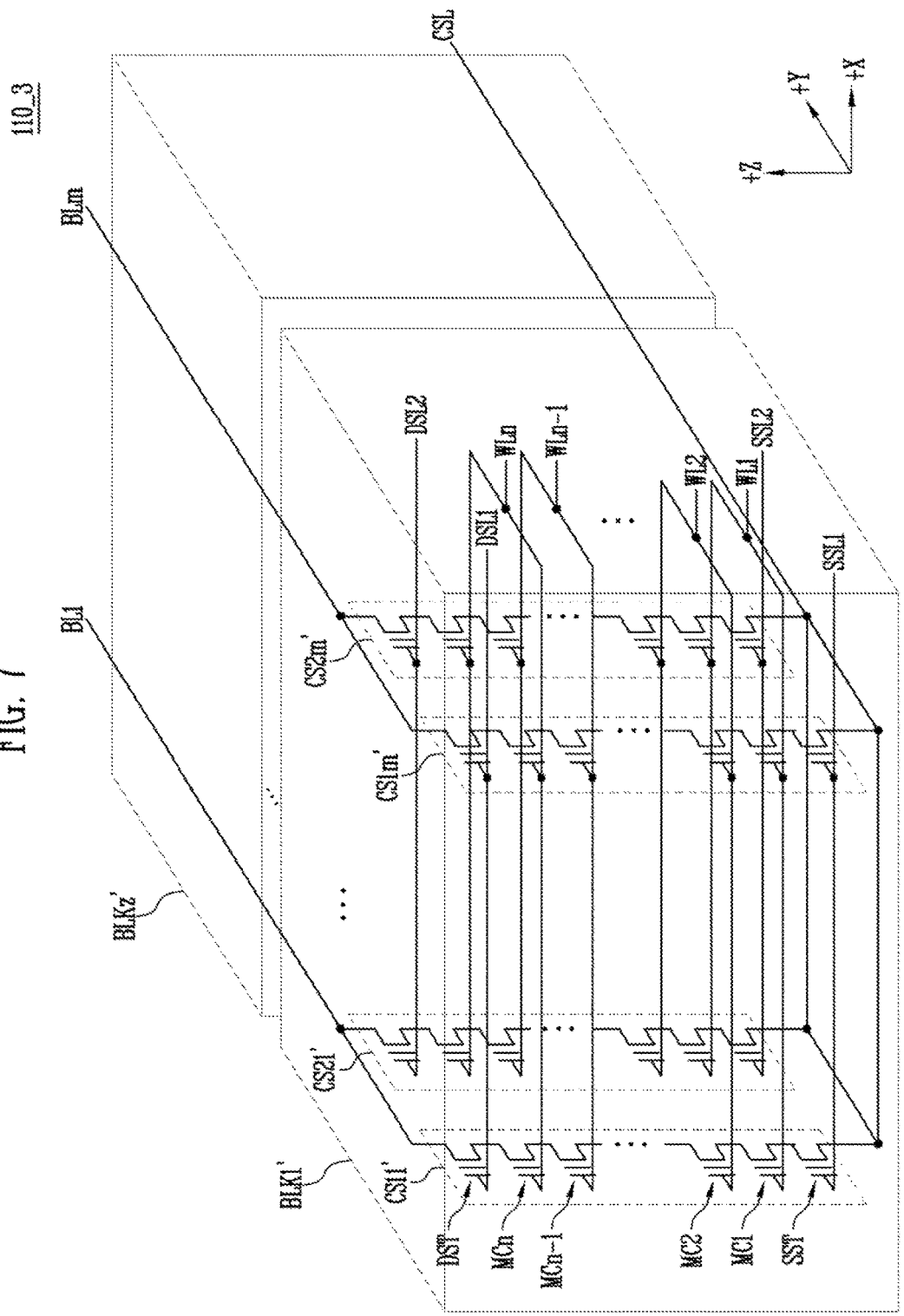
FIG. 7 is a diagram illustrating yet another embodiment of the memory cell array of FIG. 4.

FIG. 7 is a diagram illustrating yet another embodiment of the memory cell array 110 of FIG. 4.

Referring to FIG. 7, a memory cell array 110_3 includes a plurality of memory blocks BLK1' to BLKz'. In FIG. 7, the internal configuration of the first memory block BLK1 is illustrated, and the internal configuration of the other memory blocks BLK2' to BLKz' is omitted. It will be understood that each of the second to z-th memory blocks BLK2' to BLKz' has the same configuration as that of the first memory block BLK1'.

The first memory block BLK1' includes a plurality of cell strings CS11' to CS1m' and CS21' to CS2m'' Each of the plurality of cell strings CS11' to CS1m' and CS21' to CS2m' extends in a +Z direction. In the first memory block BLK1, m cell strings are arranged in the +X direction. In FIG. 7, two cell strings are shown as being arranged in a +Y direction. However, this illustration is made for convenience of description, and it will be understood that three or more cell strings may be arranged in the column direction.

Each of the cell strings CS11' to CS1m' and CS21' to CS2m' Includes at least one source select transistor SST, first to n-th memory cells MC1 to MCn, and at least one drain select transistor DST.

The source select transistor SST of each cell string is coupled between the common source line CSL and the memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In another embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

In an embodiment, at least one of the first to n-th memory cells MC1 to MCn may be used as a dummy memory cell.

When the dummy memory cell is provided, the voltage or current of the corresponding cell string may be stably controlled. Thereby, the reliability of data stored in the memory block BLK1 is improved.

The drain select transistor DST of each cell string is coupled between the corresponding bit line and the memory cells MC1 to MCn. Drain select transistors of cell strings arranged in the row direction are coupled to drain select lines extending in the row direction. Drain select transistors of cell strings CS11' to CS1m' in the first row are coupled to a first drain select line DSL1. Drain select transistors of cell strings CS21' to CS2m' in the second row are coupled to a second drain select line DSL2.

As a result, the memory block BLK1' of FIG. 7 has an equivalent circuit similar to that of the memory block BLK1 of FIG. 6 except that a pipe transistor PT is excluded from each cell string.

Figure 8:
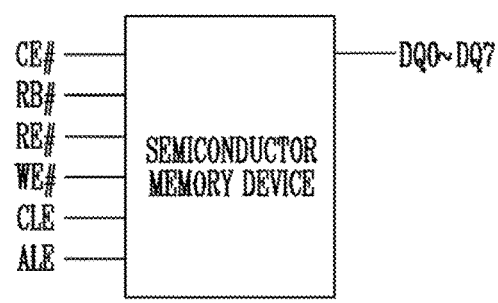
FIG. 8 is a diagram illustrating a pin configuration of the semiconductor memory device.

FIG. 8 is a diagram illustrating a pin configuration of the semiconductor memory device 100.

Referring to FIG. 8, the semiconductor memory device 100 communicates with the external controller through a plurality of lines.

The semiconductor memory device 100 communicates with the controller through a chip enable line CE#, a command latch enable line CLE, an address latch enable line ALE, a write enable line WE#, a read enable line RE#, a ready/busy line RB# and data input/output lines DQ0 to DQ7.

The chip enable line CE# transfers a signal indicating that the corresponding semiconductor memory device 100 is operable. A signal of the chip enable line CE# may be selectively applied to storage devices coupled to the same channel. The signal of the chip enable line CE# drops to a low level to indicate that a corresponding chip is enabled to operate. The signal of the chip enable line CE# is in a high level to indicate that the corresponding chip is in a standby state.

When a ready/busy line signal RB# drops to a low level while an operation in the chip is performed, the chip is not allowed to exchange another signal with the outside. When the ready/busy line signal RB# Is in a high level, this indicates that the chip is in a ready state.

A command latch enable signal CLE becomes a high level while a command CMD is inputted to a storage device. An address latch enable signal ALE becomes a high level while an address ADD is inputted to a storage device.

The command CMD and the address ADD are inputted to a selected storage device when a write enable signal WE# makes a transition from a high level to a low level.

A write enable signal WE# Is toggled when the command and address is loaded on the storage device. A read enable signal RE# is toggled when data is loaded on the controller.

The data input/output lines DQ0 to DQ7 are used for inputting a command, an address and data to the semiconductor memory device 100 or outputting data from the semiconductor memory device 100 to the controller. Since data is 8-bit data, eight data input/output lines DQ0 to DQ7 are provided. However, the number of the data input/output lines is not limited to eight, and it may be expanded to sixteen or thirty-two in various embodiments.

In accordance with an embodiment of the present disclosure, when a ready/busy signal is outputted through the ready/busy line RB# of the semiconductor memory device 100, the output current may be adjusted. In more detail, the control logic 130 shown in FIG. 4 may control the RB output control unit 141 such that the output current of the RB output control unit 141 is adjusted. The control logic 130 may generate an output control signal for adjusting the output current of the RB output control unit 141, and the RB output control unit 141 may output a ready/busy signal, wherein the output current of the output terminal may be adjusted based on the output control signal. In this case, a plurality of output drive units included in the RB output control unit 141 are selectively turned on by the output control signal, whereby the output current flowing through the output terminal is adjusted.

Figure 9:
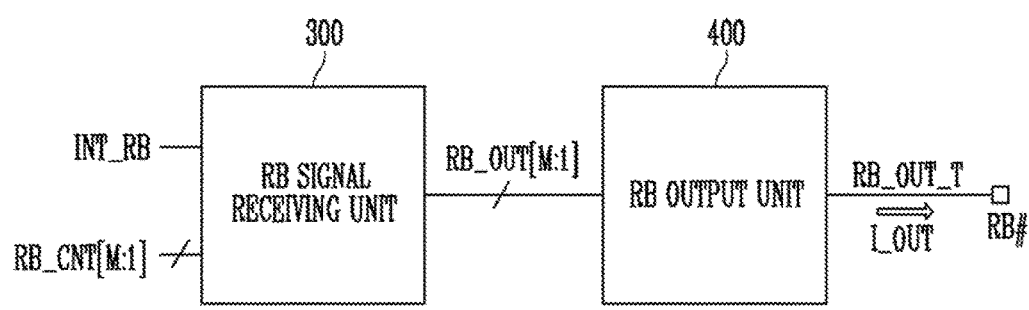
FIG. 9 is a block diagram illustrating an embodiment of an RB output control unit of FIG. 4.

FIG. 9 is a block diagram illustrating an embodiment of the RB output control unit 141 of FIG. 4.

Referring to FIG. 9, the RB output control unit 141 includes an RB signal receiving unit 300 and an RB output unit 400. The RB signal receiving unit 300 receives an internal status signal INT_RB from the status signal generator 101. The RB signal receiving unit 300 receives an output control signal RB_CNT[M:1] from the control logic 130. The RB signal receiving unit 300 generates an internal ready/busy signal RB_OUT[M:1] based on the internal status signal INT_RB and the output control signal RB_CNT[M:1].

In the embodiment of FIG. 9, the output control signal RB_CNT[M:1] may include a first output control signal RB_CNT[1] to a M-th output control signal RB_CNT[M]. Although not shown in detail in FIG. 9, M output control signals RB_CNT[1] to RB_CNT[M] may be simultaneously or sequentially inputted to the RB signal receiving unit 300. Furthermore the output control signal RB_CNT[M:1] may be generated from the control logic 130 or, as needed, may be generated from the controller 200 and transmitted through the control logic 130. Alternately, the output control signal RB_CNT[M:1] may be generated by a host outside the memory system and transmitted through the control logic 130.

In the embodiment of FIG. 9, the internal ready/busy signal RB_OUT[M:1] may include a first internal ready/busy signal RB_OUT[1] to an M-th internal ready/busy signal RB_OUT[M]. Although not shown in detail in FIG. 9, M internal ready/busy signals RB_OUT[1] to RB_OUT[M] may be simultaneously or sequentially inputted to the RB signal output unit 400.

The RB output unit 400 may output a ready/busy signal RB_OUT_T based on the internal ready/busy signal RB_OUT[M:1] received from the RB signal receiving unit 300. In this case, the RB output unit 400 may adjust output current I_OUT flowing to the ready/busy line RB# in response to the internal ready/busy signal RB_OUT[M:1]. Since the internal ready/busy signal RB_OUT[M:1] is generated based on the output control signal RB_CNT[M:1], the output current I_OUT is consequentially adjusted based on the output control signal RB_CNT[M:1].

Therefore, in the semiconductor memory device in accordance with an embodiment of the present disclosure, when the ready/busy signal RB_OUR_T is outputted, the RB output control unit 141 adjusts the output current I_OUT based on the output control signal RB_CNT[M:1]. Therefore, the power consumption of the semiconductor memory device may be reduced.

Figure 10:
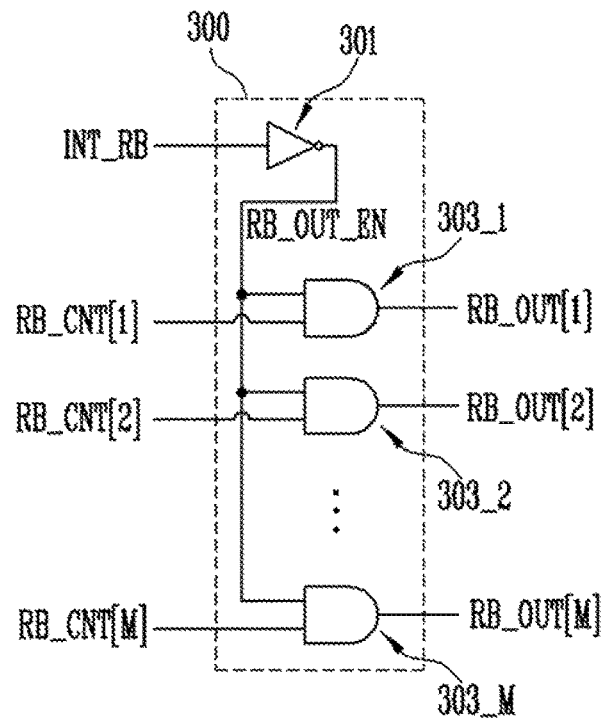
FIG. 10 is a circuit diagram illustrating an embodiment of an RB signal receiving unit of FIG. 9.

FIG. 10 is a circuit diagram illustrating an embodiment of the RB signal receiving unit 300 of FIG. 9.

Referring to FIG. 10, the RB signal receiving unit 300 includes a signal transmission unit 301 and a plurality of internal signal output units 303_1 to 303_M. The number of internal signal output units 303_1 to 303_M is M, and the internal signal output units 303_1 to 303_M respectively receive first to M-th output control signals RB_CNT[1] to RB_CNT[M]. The signal transmission unit 301 transmits an internal status signal INT_RB. In the embodiment of FIG. 10, the signal transmission unit 301 is embodied by an inverter, and inverts a received Internal status signal INT_RB and transmits it as an inverted internal status signal RB_OUT_EN.

As shown in FIG. 10, each of the internal signal output units 303_1 to 303_M may be embodied by an AND gate, and output a result of an AND operation for corresponding inputs. That is, each of the internal signal output units 303_1 to 303_M selectively outputs an inverted internal status signal RB_OUT_EN based on a corresponding one of the first to M-th output control signals RB_CNT[1] to RB_CNT[M]. For example, when the first output control signal RB_CNT[1] has a logic-high value, the first internal signal output unit 303_1 may output an inverted internal status signal RB_OUT_EN as the first internal ready/busy signal RB_OUT[1]. When the first output control signal RB_CNT[1] has a logic-low value, the first internal signal output unit 303_1 may output a logic-low value as the first internal ready/busy signal RB_OUT[1]. The second through M-th internal signal output units 303_2 to 303_M may also perform the same function.

That is, the first to M-th internal signal output units 303_2 to 303_M respectively generate internal ready/busy signals RB_OUT[1] to RB_OUT[M] based on the first to M-th received output control signals RB_CNT[1] to RB_CNT[M]. When the corresponding output control signal RB_CNT has a logic-high value, the internal signal output unit 300 outputs an inverted internal status signal RB_OUT_EN as a corresponding internal ready/busy signal RB_OUT. When the corresponding output control signal RB_CNT has a logic-low value, the internal signal output unit 300 outputs a logic-low value as a corresponding internal ready/busy signal RB_OUT.

Figure 11:
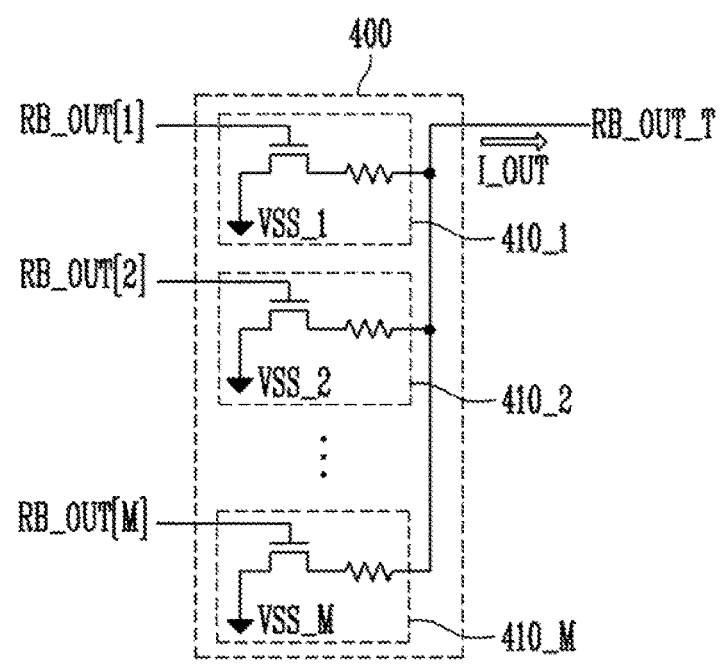
FIG. 11 is a circuit diagram illustrating an embodiment of an RB output unit of FIG. 9.

FIG. 11 is a circuit diagram illustrating an embodiment of the RB output unit 400 of FIG. 9.

Referring to FIG. 11, the RB output unit 400 may include a plurality of output drive units 401_1 to 401_M. The plurality of output drive units 401_1 to 401_M respectively receive corresponding internal ready/busy signals RB_OUT[1] to RB_OUT[M] and are selectively turned-on based on the internal ready/busy signals RB_OUT[1] to RB_OUT[M]. Output terminals of the respective output drive units 401_1 to 401_M are coupled to an output terminal of the RB output unit 400.

In the embodiment shown in FIG. 11, the plurality of output drive units 401_1 to 401_M respectively includes transistors coupled to corresponding supply voltages VSS_1 to VSS_M. The supply voltages VSS_1 to VSS_M may have the same voltage value, or may have different values in some embodiments. Furthermore, internal ready/busy signals RB_OUT[1] to RB_OUT[M] are inputted to corresponding gate electrodes of the transistors. Each of the output drive units 401_1 to 401_M Includes a resistor coupled to the corresponding transistor.

As described above with reference to FIG. 10, depending on the voltage value of the output control signal RB_CNT[M:1], the inverted internal status signal RB_OUT_EN or the logic-low signal is outputted as the internal ready/busy signal RB_OUT[M:1]. Therefore, each of the output drive units 401_1 to 401_M may be turned on by the corresponding inverted internal status signal RB_OUT_EN or turned off by the corresponding logic-low signal, depending on the voltage value of the output control signal RB_CNT[M:1]. When the resistors included in the output drive units 401_1 to 401_M have the same resistance value, the magnitude of the output current I_OUT is proportional to the number of turned-on output drive units 401_1 to 401_M. For example, when only half of the output drive units 401_1 to 401_M is turned on, the magnitude of the output current I_OUT is reduced to half, compared to that of when all of the output drive units 401_1 to 401_M are turned on. The semiconductor memory device 100 in accordance with the present disclosure is configured such that the output drive units 401_1 to 401_M are selected based on the output control signal RB_CNT[M:1], whereby the value of the output current I_OUT may be adjusted.

The control logic 130 may determine the number of output drive units 401_1 to 401_M to be turned on so as to adjust the output current I_OUT. As needed, the control logic 130 may determine to turn on all of the output drive units 401_1 to 401_M. In this case, the control logic 130 may generate the first to M-th output control signals RB_CNT[1] to RB_CNT[M] included in the output control signal RB_CNT[M:1] such that each of the first to M-th output control signals RB_CNT[1] to RB_CNT[M] has a logic-high value. Therefore, as shown in FIG. 10, the internal signal output units 303_1 to 303_M may output the inverted internal status signal RB_OUT_EN as first to M-th internal ready/busy signals RB_OUT[1] to RB_OUT[M]. As shown in FIG. 11, the first to M-th output drive units 410_1 to 410_M therefore receive the first to M-th Internal ready/busy signals RB_OUT[1] to RB_OUT[M] having the same value and consequently output a corresponding ready/busy signal RB_OUT_T. In this case, the output current I_OUT is M times the current outputted from the single output drive unit.

As needed, the control logic 130 may determine to turn on half of the output drive units 401_1 to 401_M. In this case, the control logic 130 may generate the output control signals RB_CNT[M:1] such that each of the first to M/2-th output control signals RB_CNT[1] to RB_CNT[M/2] has a logic-high value and each of the [(M/2)+1]-th to M-th output control signals RB_CNT[M/2+1] to RB_CNT[M] has a logic-low value. Therefore, as shown in FIG. 10, the internal signal output units 303_1 to 303_M/2 may output the inverted internal status signal RB_OUT_EN as first to M/2-th internal ready/busy signals RB_OUT[1] to RB_OUT[M/2]. Furthermore, the internal signal output units 303_M/2+1 to 303_M may output a signal having a logic-low value as [(2/M)+1]-th to M-th internal ready/busy signals RB_OUT[M/2+1] to RB_OUT[M]. As shown in FIG. 11, the first to M/2-th output drive units 410_1 to 410_M/2 therefore receive the first to M/2-th internal ready/busy signals RB_OUT[1] to RB_OUT[M/2] each having a value related to the internal status signal, and consequently output a corresponding ready/busy signal RB_OUT_T. Furthermore, the [(M/2)+1]-th to M-th output drive units 410_M/2+1 to 410_M respectively receive [(M/2)+1]-th to M-th internal ready/busy signals RB_OUT[M/2+1] to RB_OUT[M] each having a logic-low value, and are consequently turned off. In this case, the output current I_OUT becomes M/2 times the current outputted from the single output drive unit. Although there has been illustrated the embodiment in which only half of the output drive units are turned on, it will be understood that various embodiments in which one to M output drives are selectively turned on as needed are also possible.

As needed, the control logic 130 may determine to turn off all of the output drive units 401_1 to 401_M. In this case, the control logic 130 may generate first to M-th output control signals RB_CNT[1] to RB_CNT[M] included in the output control signal RB_CNT[M:1] such that each of the first to M-th output control signals RB_CNT[1] to RB_CNT[M]

has a logic-low value. Therefore, as shown in FIG. 10, the internal signal output units 303_1 to 303_M may output signals each having a logic-low value as first to M-th internal ready/busy signals RB_OUT[1] to RB_OUT[M]. Consequently, as shown in FIG. 11, all of the first to M-th output drive units 410_1 to 410_M may be turned off. In this case, the output current I_OUT may have a value of 0.

In the aforementioned embodiments, there has been described the example in which the control logic 130 determines the number of output drive units 401_1 to 401_M to be turned on and generates a corresponding output control signal RB_CNT[M:1]. However, depending on embodiments, the number of output drive units 401_1 to 401_M to be turned on may be determined by the controller 200, and a corresponding output control signal RB_CNT[M:1] may be generated. In another embodiment, the number of output drive units 401_1 to 401_M to be turned on may be determined by the host outside the memory system, and a corresponding output control signal RB_CNT[M:1] may be generated.

As described above, in the semiconductor memory device according to an embodiment of the present disclosure, the number of output drive units to be turned on among the plurality of output drive units 401_1 to 401_M included in the RB output control unit 141 may be determined as needed. Thereby, the value of the output current I_OUT flowing through the output terminal of the ready/busy signal may be controlled.

Figure 12:
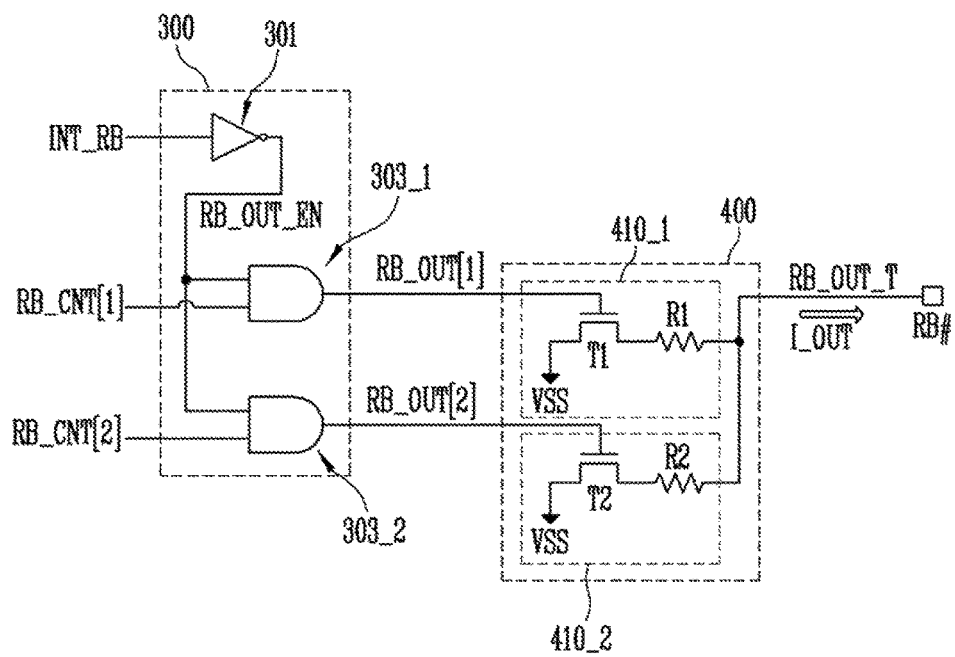
FIG. 12 is a circuit diagram illustrating an embodiment of the RB output control unit.

FIG. 12 is a circuit diagram illustrating an embodiment of the RB output control unit 141.

Referring to FIG. 12, there is illustrated an embodiment In which the RB signal receiving unit 300 includes two internal signal output units 303_1 and 303_2, and the RB output unit 400 includes two output drive units 410_1 and 410_2. Therefore, the control logic 130 may determine to turn on both the output drive units 410_1 and 410_2, turn on only one of the output drive units 410_1 and 410_2, or turn off both the output drive units 410_1 and 410_2.

When the control logic 130 determines to turn on both the output drive units 410_1 and 410_2, both the first output control signal RB_CNT[1] and the second output control signal RB_CNT[2] have logic-high values. Therefore, an inverted internal status signal RB_OUT_EN is outputted as the internal ready/busy signals RB_OUT[1] and RB_OUT[2], and the output drive units 410_1 and 410_2 output the same signal according to an internal power supply VSS as the ready/busy signal RB_OUT_T.

When the control logic 130 determines to turn on only some of the output drive units 410_1 and 410_2, either the first output control signal RB_CNT[1] or the second output control signal RB_CNT[2] has a logic-high value, and the other has a logic-low value. In this case, a corresponding one of the internal ready/busy signals RB_OUT[1] and RB_OUT[2] has an inverted internal status signal RB_OUT_EN, and the other has a logic-low signal. Therefore, a corresponding one of the output drive units 410_1 and 410_2 outputs a signal according to the internal power supply VSS as the ready/busy signal RB_OUT_T, and the other is turned off. In this case, the magnitude of the output current I_OUT to be outputted to the ready/busy line RB# is half of the magnitude of the output current to be outputted to the ready/busy line RB# when both the output drive units 410_1 and 410_2 are turned on.

When the control logic 130 determines to turn off both the output drive units 410_1 and 410_2, both the first output control signal RB_CNT[1] and the second output control signal RB_CNT[2] have logic-low values. Therefore, a signal having a logic-low value is outputted as the internal ready/busy signals RB_OUT[1] and RB_OUT[2], and the output drive units 410_1 and 410_2 are turned off. Therefore, in this case, there is substantially no current flow through the ready/busy line RB#.

In FIG. 12, there has been illustrated an example of the RB output control unit having two internal signal output units 303_1 and 303_2 and two output drive units 410_1 and 410_2. However, it will be understood that the RB output control unit may include three or more numbers of internal signal output units and output drive units, as needed.

Figure 13:
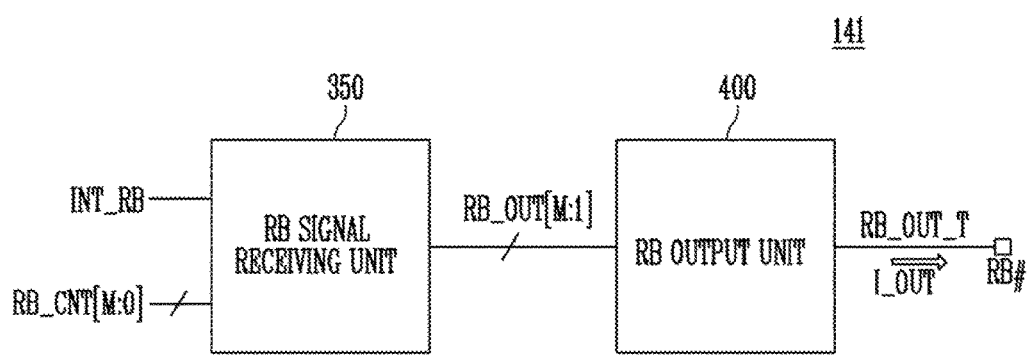
FIG. 13 is a block diagram illustrating another embodiment of the RB output control unit of FIG. 4.

FIG. 13 is a block diagram illustrating another embodiment of the RB output control unit 141 of FIG. 4.

Referring to FIG. 13, the RB output control unit 141 includes an RB signal receiving unit 350 and an RB output unit 400. The RB signal receiving unit 350 receives an internal status signal INT_RB from the status signal generator 101. The RB signal receiving unit 350 receives an output control signal RB_CNT[M:0] from the control logic 130. The RB signal receiving unit 350 generates an internal ready/busy signal RB_OUT[M:1] based on the internal status signal INT_RB and the output control signal RB_CNT[M:0]. There is a difference in the output control signal RB_OUT to be inputted to the RB signal receiving unit between the embodiment of FIG. 13 and the embodiment of FIG. 9. The RB signal receiving unit 350 of FIG. 13 will be described in more detail with reference to FIG. 14.

Figure 14:
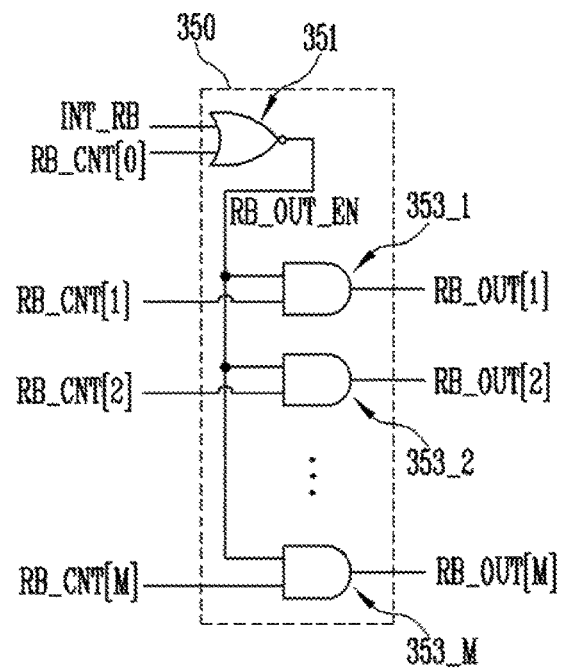
FIG. 14 is a circuit diagram illustrating an embodiment of the RB signal receiving unit of FIG. 13.

FIG. 14 is a circuit diagram illustrating an embodiment of the RB signal receiving unit 350 of FIG. 13.

Referring to FIG. 14, the RB signal receiving unit 350 includes a signal transmission unit 351 and a plurality of internal signal output units 353_1 to 353_M. The number of internal signal output units 353_1 to 353_M is M, and the internal signal output units 353_1 to 353_M respectively receive first to M-th output control signals RB_CNT[1] to RB_CNT[M]. The signal transmission unit 351 receives a zeroth output control signal RB_CNT[0] and selectively transmits the internal status signal INT_RB. In the embodiment of FIG. 14, the signal transmission unit 351 is embodied by a NOR gate. In this case, the signal transmission unit 351 may output a result of a NOR operation for inputs. That is, the signal transmission unit 351 inverts a received internal status signal INT_RB based on the zeroth output control signal RB_CNT[0] and transmits it as an inverted status signal RB_OUT_EN. That is, when the zeroth output control signal RB_CNT[0] has a logic-low value, the NOR gate is operated as an inverter which inverts the internal status signal INT_RB. Therefore, when the zeroth output control signal RB_CNT[0] has a logic-low value, the RB signal receiving unit 300 shown in FIG. 14 is operated in the same manner as that of the RB signal receiving unit shown in FIG. 10.

When the zeroth output control signal RB_CNT[0] has a logic-low value, the signal transmission unit 351 outputs a logic-low value regardless of the internal status signal INT_RB. Therefore, each of the internal signal output units 353_1 to 353_M which has the logic-low value as a first input value also outputs the logic-low value regardless of a corresponding one of the first to M-th output control signals RB_CNT[1] to RB_CNT[M]. Consequently, the output drive units 401_1 to 401_M of the RB output unit 400 are turned off. That is, in the embodiment shown in FIG. 14, all of the output drive units 401_1 to 401_M may be turned off only by maintaining the zeroth output control signal RB_CNT[0 ] to be inputted to the signal transmission unit 351 in a logic-high value. When the zeroth output control signal RB_CNT[O] is maintained in a logic-low value, the number of output drive units 401_1 to 401_M to be turned on in the RB output unit 400 may be adjusted by controlling the first to M-th output control signals RB_CNT[1] to RB_CNT[M]. Consequently, the magnitude of the output current I_OUT of the ready/busy line RB# may be controlled.

Figure 15:
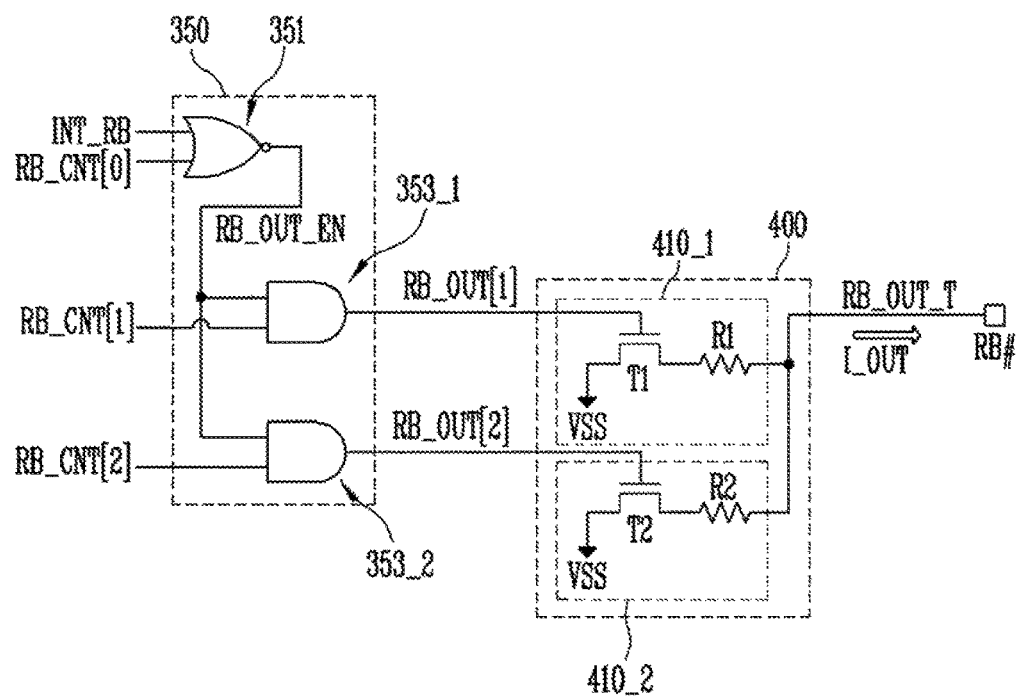
FIG. 15 is a circuit diagram illustrating another embodiment of the RB output control unit of FIG. 4.

FIG. 15 is a circuit diagram illustrating another embodiment of the RB output control unit 141.

Referring to FIG. 15, there is illustrated an embodiment in which the RB signal receiving unit 350 includes two internal signal output units 353_1 and 353_2, and the RB output unit 400 includes two output drive units 410_1 and 410_2. Therefore, the control logic 130 may determine to turn on both the output drive units 410_1 and 410_2, turn on only one of the output drive units 410_1 and 410_2, or turn off both the output drive units 410_1 and 410_2.

When the control logic 130 determines to turn on both the output drive units 410_1 and 410_2, both the first output control signal RB_CNT[1] and the second output control signal RB_CNT[2] have logic-high values. Furthermore, the zeroth output control signal RB_CNT[0] has a logic-low value. Therefore, an inverted internal status signal RB_OUT_EN is outputted as the internal ready/busy signals RB_OUT[1] and RB_OUT[2], and the output drive units 410_1 and 410_2 output the same signal according to an internal power supply VSS as the ready/busy signal RB_OUT_T.

When the control logic 130 determines to turn on only some of the output drive units 410_1 and 410_2, either the first output control signal RB_CNT[1] or the second output control signal RB_CNT[2] has a logic-high value, and the other has a logic-low value. Furthermore, the zeroth output control signal RB_CNT[0] has a logic-low value. In this case, a corresponding one of the internal ready/busy signals RB_OUT[1] and RB_OUT[2] has an inverted internal status signal RB_OUT_EN, and the other has a logic-low signal. Therefore, a corresponding one of the output drive units 410_1 and 410_2 outputs a signal according to the internal power supply VSS as the ready/busy signal RB_OUT_T, and the other is turned off. In this case, the magnitude of the output current I_OUT to be outputted to the ready/busy line RB# is half of the magnitude of the output current to be outputted to the ready/busy line RB# when both the output drive units 410_1 and 410_2 are turned on.

When the control logic 130 determines to turn off both the output drive units 410_1 and 410_2, both the first output control signal RB_CNT[1] and the second output control signal RB_CNT[2] may have logic-low values. Alternatively, regardless of the first output control signal RB_CNT[1] and the second output control signal RB_CNT[2], the zeroth output control signal RB_CNT[0] may have a logic-high value. Therefore, a signal having a logic-low value is outputted as the internal ready/busy signals RB_OUT[1] and RB_OUT[2], and the output drive units 410_1 and 410_2 are turned off. Therefore, in this case, there is substantially no current flow through the ready/busy line RB#.

In FIG. 15, there has been illustrated an example of the RB output control unit having two internal signal output units 353_1 and 353_2 and two output drive units 410_1 and 410_2. However, it will be understood that the RB output control unit may include three or more numbers of internal signal output units and output drive units, as needed.

Figure 16:
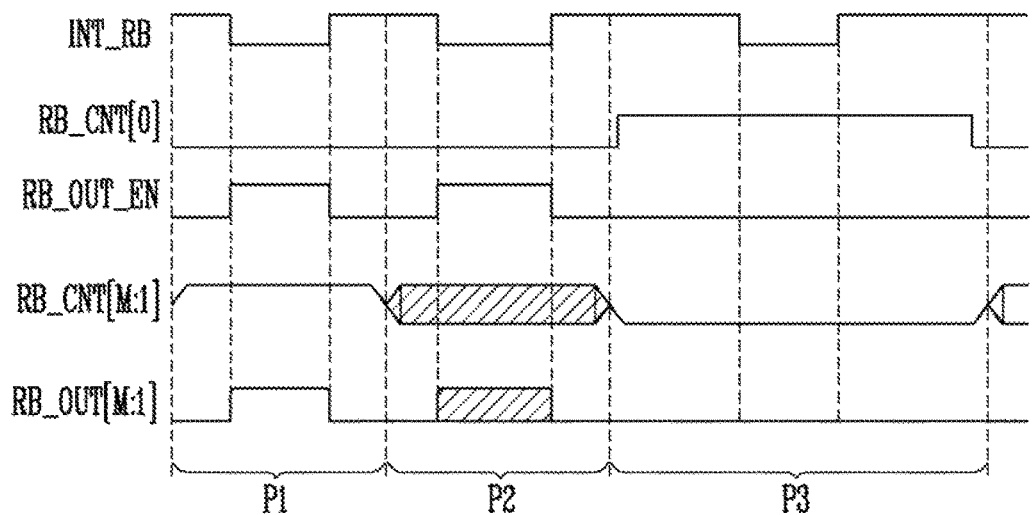
FIG. 16 is a timing diagram illustrating the operation of the RB output control unit of FIG. 13.

FIG. 16 is a timing diagram illustrating the operation of the RB output control unit 141 of FIG. 13.

Referring to FIG. 16, there are illustrated an internal status signal INT_RB, a zeroth output control signal RB_CNT[0], an inverted internal status signal RB_OUT_EN, an output control signal RB_CNT[M:1], and an internal ready/busy signal RB_OUT[M:1] during a first period P1, a second period P2, and a third period P3.

During the first period P1, all of the output drive units 401_1 to 401_M are turned on. For this, the zeroth output control signal RB_CNT[0] has a logic-low value, and each of the first to M-th output control signals RB_CNT[M:1] has a logic-high value. Therefore, the internal status signal INT_RB is inverted in the signal transmission unit 351 and outputted as an inverted internal status signal RB_OUT_EN. The internal ready/busy signals RB_OUT[M:1] have the same output as that of the inverted internal status signal RB_OUT_EN. During the first period P1, all of the output drive units 401_1 to 401_M are turned on, so that the output current I_OUT has a comparatively large current value.

During the second period P2, only some of the output drive units 401_1 to 401_M are turned on. For this, the zeroth output control signal RB_CNT[0] has a logic-low value, and some of the first to M-th output control signals RB_CNT[M:1] have logic-high values, and the other output control signals have logic-low values. Therefore, the internal status signal INT_RB is inverted in the signal transmission unit 351 and outputted as an inverted internal status signal RB_OUT_EN. Some of the internal ready/busy signals RB_OUT[M:1] have logic-low values, and the other internal ready/busy signals have the same output as that of the inverted internal status signal RB_OUT_EN. During the second period P2, only some of the output drive units 401_1 to 401_M are turned on, so that the output current I_OUT has a value less than that during the first period P1. The value of the output current I_OUT during the second period P2 may be determined based on the number of turned-on output drive units.

During the third period P3, all of the output drive units 401_1 to 401_M are turned off. For this, the zeroth output control signal RB_CNT[0] has a logic-high value. Therefore, regardless of the internal status signal INT_RB, a signal having a logic-low value is outputted from the output terminal of the signal transmission unit 351. Alternatively, the first to M-th output control signals RB_CNT[M:1] may have logic-low values. Consequently, each of the internal ready/busy signals RB_OUT[M:1] becomes a signal having a logic-low value, and all of the output drive units are turned off. During the third period P3, there may be substantially no current flow through the output terminal.

Figure 17:
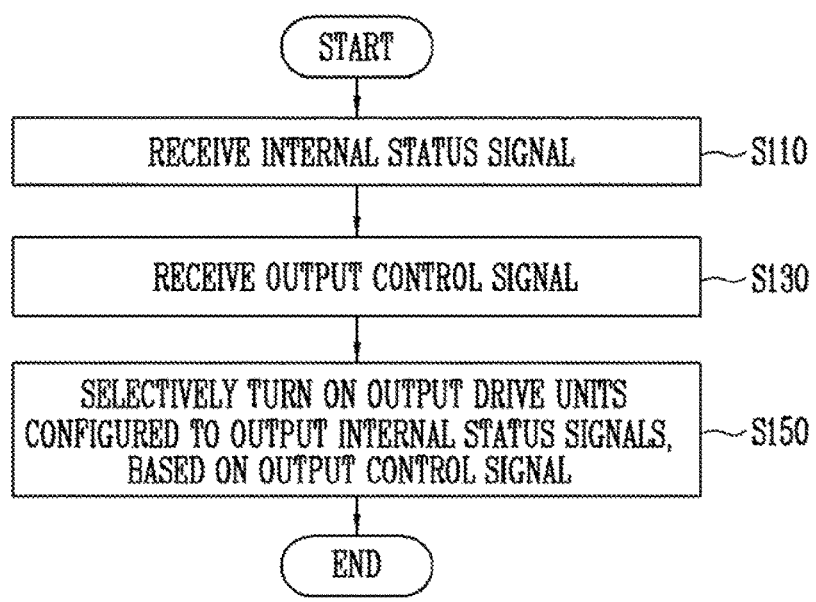
FIG. 17 is a flowchart of a method for operating a semiconductor memory device in accordance with an embodiment of the present disclosure.

FIG. 17 is a flowchart of a method for operating a semiconductor memory device in accordance with an embodiment of the present disclosure.

Referring to FIG. 17, the method for operating the semiconductor memory device includes the step S110 of receiving an internal status signal INT_RB indicating whether the memory cell array is performing an internal operation, the step S130 of receiving an output control signal generated to control the output current I_OUT, and the step S150 of selectively turning on, based on the output control signal, the plurality of output drive units 401_1 to 401_M which output the internal status signal INT_RB as the ready/busy signal RB_OUT_T.

The step S150 of selectively turning on, based on the output control signal, the plurality of output drive units 401_1 to 401_M, which output the internal status signal INT_RB as the ready/busy signal RB_OUT_T, includes the step of selectively outputting the internal status signal INT_RB based on the output control signal, and generating an internal ready/busy signal RB_OUT[M:1], and the step of receiving the internal ready/busy signal RB_OUT[M:1] and selectively turning on the transistors included in the respective output drive units 401_1 to 401_M. The foregoing steps may be performed through the process described with reference to FIGS. 10 to 12 or FIGS. 14 and 15.

The step of selectively outputting the internal status signal INT_RB based on the output control signal, and generating the internal ready/busy signal RB_OUT[M:1] may include the step of logically inverting the internal status signal INT_RB, and the step of performing an AND operation between the logic-inverted internal status signal INT_RB and the output control signal RB_CNT[M:1] and generating the internal ready/busy signal RB_OUT[M:1]. The foregoing steps may be performed through the process described with reference to FIG. 10.

In another embodiment, the step of selectively outputting the internal status signal INT_RB based on the output control signal, and generating the internal ready/busy signal RB_OUT[M:1] may include the step of performing a NOR operation between the internal status signal and the zeroth output control signal RB_CNT[0], and the step of performing AND operations between a signal resulting from the NOR operation RB OUT EN and one of the first output control signal RB_CNT[1] to the M$^{th}$ output control signal RB CNT[M], and generating the internal ready/busy signal RB OUT[M:1] based on the AND operations. M is a positive integer greater than 1. The foregoing steps may be performed through the process described with reference to FIG. 14. In this regard, the zeroth output control signal RB_CNT [0] to the M$^{th}$ output control signal RB_CNT [M] may be included in the output control signal RB_CNT[M:0]. In addition, the first internal ready/busy signal RB OUT[1] to the M$^{th}$ internal ready/busy signal RB OUT[M] may be included in the internal ready/busy signal RB OUT[M:1].

As described above, in the semiconductor memory device and the operating method thereof in accordance with an embodiment of the present disclosure, when a ready/busy signal is outputted, output drive units may be selectively turned on so as to control the output current. Thereby, the power consumption of the semiconductor memory device may be reduced.

Figure 18:
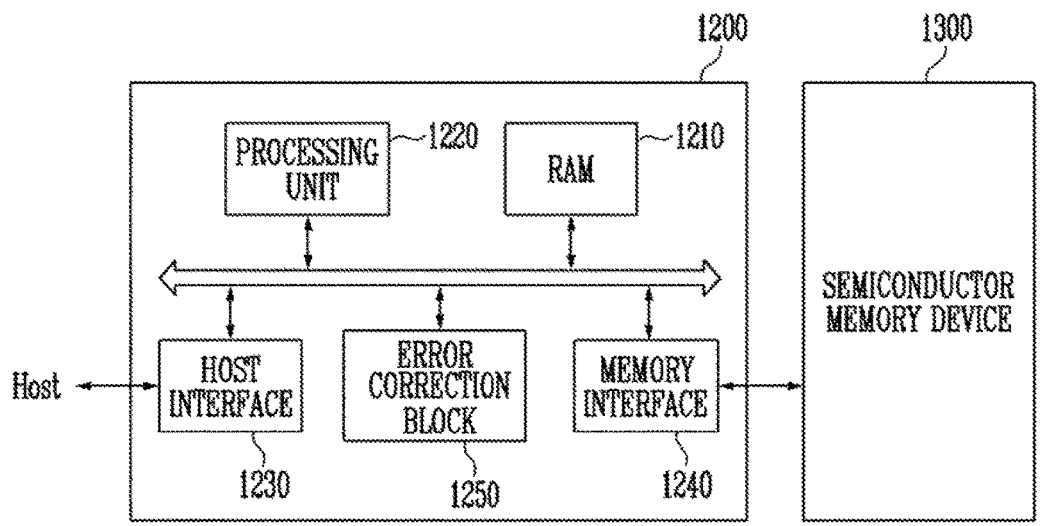
FIG. 18 is a block diagram illustrating a memory system (1000) including the semiconductor memory device of FIG. 4.

FIG. 18 is a block diagram showing a memory system 1000 including the semiconductor memory device of FIG. 4.

Referring to FIG. 18, the memory system 1000 includes a semiconductor memory device 1300 and a controller 1200.

The semiconductor memory device 1300 may have the same configuration and operation as those of the semiconductor memory device described with reference to FIG. 4. Hereinafter, repetitive descriptions will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, program, erase, and background operations of the semiconductor memory device 1300. The controller 1200 is configured to provide an interface between the host Host and the semiconductor memory device 1300. The controller 1200 is configured to drive firmware for controlling the semiconductor memory device 1300.

The controller 1200 includes a RAM (Random Access Memory) 1210, a processing unit 1220, a host interface 1230, a memory interface 1240, and an error correction block 1250.

The RAM 1210 is used as any one of a work memory of the processing unit 1220, a cache memory between the semiconductor memory device 1300 and the host Host, and a buffer memory between the semiconductor memory device 1300 and the host Host.

The processing unit 1220 controls the overall operation of the controller 1200. The processing unit 1220 is configured to control a read operation, a program operation, an erase operation and a background operation of the semiconductor memory device 1300. The memory control unit 1220 is configured to run firmware for controlling the semiconductor memory device 100. The processing unit 1220 may perform a function of a Flash Translation Layer (FTL). The processing unit 1220 may translate a logical block address (LBA), provided by the host, into a physical block address (PBA) through the FTL. The FTL may receive the LBA using a mapping table and may translate the LBA into the PBA. Address mapping methods performed through the FTL include various methods according to a mapping unit. Representative address mapping methods include a page mapping method, a block mapping method, and a hybrid mapping method.

The processing unit 1220 is configured to randomize data received from the Host. For example, the processing unit 1220 may use a randomizing seed to randomize data received from the Host. The randomized data is provided, as data to be stored, to the semiconductor memory device 1300 and is then programmed in the memory cell array.

The processing unit 1220 is configured to derandomize data received from the semiconductor memory device 1300 during a read operation. For example, the processing unit 1220 may use a derandomizing seed to derandomize data received from the semiconductor memory device 1300. Derandomized data may be outputted to the host Host.

In an embodiment, the processing unit 1220 may drive software or firmware to perform the randomizing or derandomizing operation.

The host interface 1230 includes a protocol for performing data exchange between the host Host and the controller 1200. In an exemplary embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1240 interfaces with the semiconductor memory device 1300. For example, the memory interface 1240 includes a NAND interface or NOR interface.

The error correction block 1250 is configured to use an error correcting code (ECC) to detect and correct an error in data received from the semiconductor memory device 1300. The error correction block 1250 may correct errors from read page data using an ECC. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the error correction block 1250 may correct errors from read page data. When a number of error bits exceeding the number of correctable bits are included in the read page data, decoding may fail. When a number of error bits less than or equal to the number of correctable bits are included in the page data, decoding may succeed. A success in decoding indicates that the corresponding read command has passed. A failure in decoding indicates that the corresponding read command has failed. When decoding succeeds, the controller 1200 outputs error-corrected page data to the host.

The controller 1200 and the semiconductor memory device 1300 may be integrated into a single semiconductor device. In an exemplary embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD includes a storage device configured to store data in a semiconductor memory. When the memory system is used as the SSD, an operation speed of the host Host coupled to the memory system may be phenomenally improved.

In another embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 1300 or the memory system may be embedded in various types of packages. For example, the semiconductor memory device 1300 or the memory system may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 19:
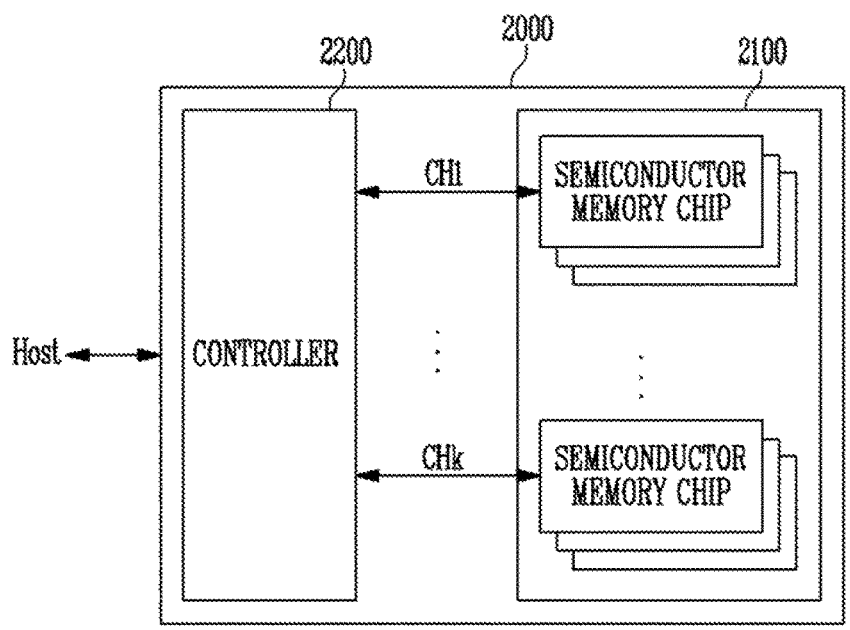
FIG. 19 is a block diagram illustrating an example (2000) of application of the memory system of FIG. 18.

FIG. 19 is a block diagram illustrating an example 2000 of application of the memory system of FIG. 18.

Referring to FIG. 19, the memory system 2000 includes a semiconductor memory device 2100 and a controller 2200. The semiconductor memory device 2100 includes a plurality of semiconductor memory chips. The semiconductor memory chips are divided into a plurality of groups.

In FIG. 19, it is illustrated that each of the plurality of groups communicates with the controller 2200 through first to k-th channels CH1 to CHk. Each semiconductor memory chip may have the same configuration and operation as those of an embodiment of the semiconductor memory device 1300 described with reference to FIG. 18.

Each group communicates with the controller 2200 through one common channel. The controller 2200 has the same configuration as that of the controller 1200 described with reference to FIG. 18 and is configured to control the plurality of memory chips of the semiconductor memory device 2100 through the plurality of channels CH1 to CHk.

In FIG. 19, a description has been made of a plurality of semiconductor memory chips coupled to a single channel. However, it will be understood that the memory system 2000 may be modified such that a single semiconductor memory chip is coupled to a single channel.

Figure 20:
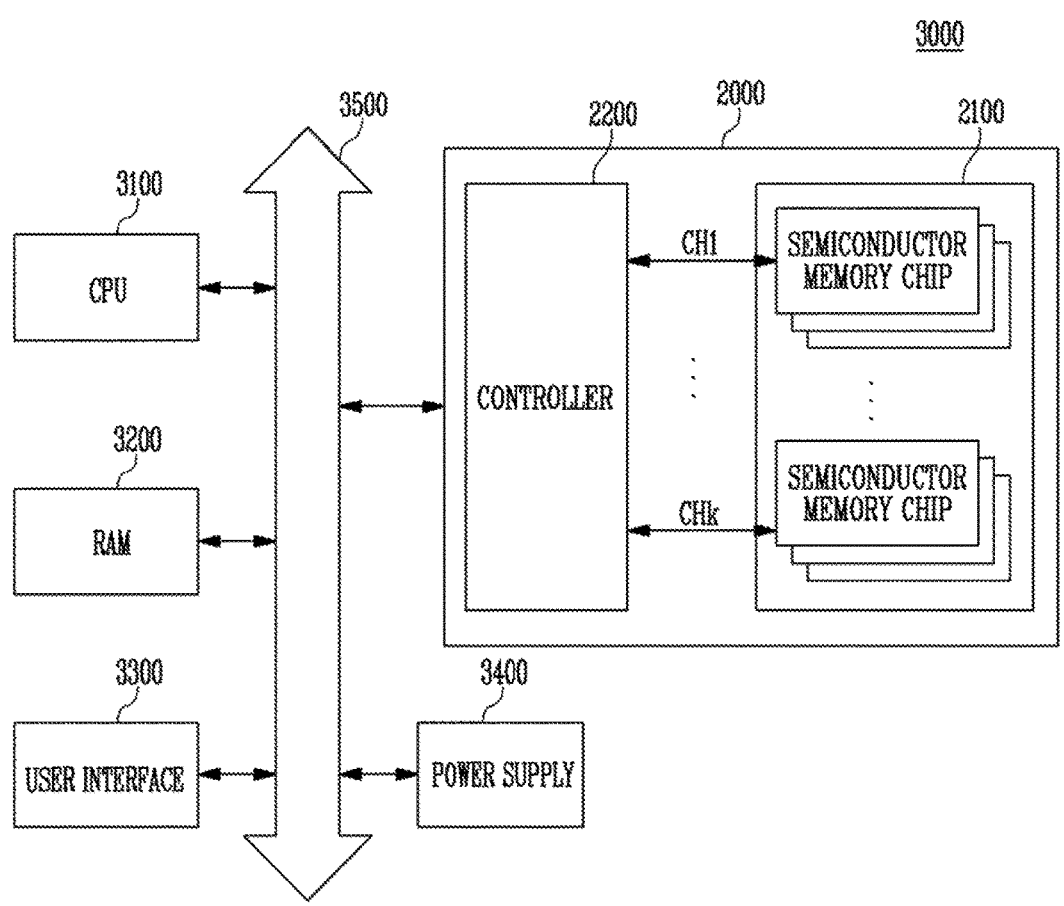
FIG. 20 is a block diagram showing a computing system including the memory system illustrated with reference to FIG. 19.

FIG. 20 is a block diagram showing a computing system including the memory system described with reference to FIG. 19.

Referring to FIG. 20, the computing system 3000 may include a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 20, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 20, the memory system 2000 described with reference to FIG. 19 is illustrated as being provided. However, the memory system 2000 may be replaced with the memory system 1000 described with reference to FIG. 18. In an embodiment, the computing system 3000 may be configured to include all of the memory systems 1000 and 2000 described with reference to FIGS. 18 and 19.

An embodiment of the present disclosure provides a semiconductor memory device which may control the output current to be outputted to a ready/busy pad.

Another embodiment of the present disclosure provides a method for operating the semiconductor memory device which may control the output current to be outputted to the ready/busy pad.

Example embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
    a memory cell array including a plurality of memory cells;
    a status signal generator configured to output an internal status signal indicating whether the memory cell array is performing an internal operation;
    an RB output control unit configured to output a ready/busy signal based on the internal status signal, the RB output control unit comprising an RB output unit having a plurality of output drive units, each selectively turned on based on an internal ready/busy signal; and
a control logic configured to control the RB output control unit to adjust an output current of the RB output control unit while the internal status signal is enabled,
wherein each of the output drive units is coupled to a ready/busy pad, and configured to output the ready busy signal, and
wherein the RB output unit adjusts the output current depending on a number of turned-on output drive units among the plurality of output drive units.

2. The semiconductor memory device according to claim 1, wherein the RB output control unit further comprises:
an RB signal receiving unit configured to receive the internal status signal, receive an output control signal from the control logic, and output the internal ready/busy signal,
wherein the RB output unit configured to output the ready/busy signal based on the internal ready/busy signal, and adjust the output current based on the output control signal.

3. The semiconductor memory device according to claim 2, wherein the RB signal receiving unit comprises:
a signal transmission unit configured to transmit the internal status signal; and
a plurality of internal signal output units each configured to selectively output the internal status signal based on the output control signal, and generating the internal ready/busy signal.

4. The semiconductor memory device according to claim 3, wherein the signal transmission unit includes an inverter.

5. The semiconductor memory device according to claim 3, wherein the signal transmission unit includes a NOR gate.

6. The semiconductor memory device according to claim 5, wherein the NOR gate outputs a result of a NOR operation between the internal status signal and the corresponding output control signal.

7. The semiconductor memory device according to claim 3, wherein each of the internal signal output units includes an AND gate configured to perform an AND operation between the internal status signal outputted from the signal transmission unit and the corresponding output control signal, and output a result of the AND operation as the internal ready/busy signal.

8. The semiconductor memory device according to claim 1, wherein the output drive unit comprises:
a transistor coupled to a supply voltage and configured to receive the internal ready/busy signal through a gate electrode thereof; and
a resistor coupled between the transistor and the ready/busy pad.

9. A method for operating a semiconductor memory device having at least one semiconductor memory chip, comprising:
receiving an internal status signal indicating whether a memory cell array is performing an internal operation;
receiving an output control signal which is generated to adjust an output current flowing to an output terminal; and
selectively turning on the plurality of output drive units included in the semiconductor memory chip each configured to output the internal status signal of the semiconductor memory chip as a ready/busy signal, based on the output control signal,
wherein the selectively turning on the plurality of output drive units comprises:
generating an internal ready/busy signal by selectively outputting the internal status signal based on the output control signal; and
receiving the internal ready/busy signal and selectively turning on transistors included in the respective output drive units.

10. The method according to claim 9, wherein the generating of the internal ready/busy signal comprises:
logically-inverting the internal status signal; and
generating the internal ready/busy signal by performing an AND operation between the logically-inverted internal status signal and the output control signal.

11. The method according to claim 9,
wherein the generating of the internal ready/busy signal comprises:
performing a NOR operation between the internal status signal and a zeroth output control signal; and
generating a first internal ready/busy signal by performing an AND operation between a result of the NOR operation and a first output control signal, and
wherein the zeroth output control signal and the first output control signal are included in the output control signal, and
wherein the first internal ready/busy signal is included in the internal ready/busy signal.

12. The method according to claim 9, wherein the output current is adjusted depending on a number of turned-on output drive units among the plurality of output drive units.

13. The method according to claim 9, wherein the output current flowing to an output terminal is adjusted by selectively turning on the transistors included in the respective output drive units.

14. The method according to claim 9,
wherein the generating of the internal ready/busy signal comprises:
performing a NOR operation between the internal status signal and a zeroth output control signal; and
generating $1^{st}$ to $M^{th}$ internal ready/busy signals by performing AND operations between the result of the NOR operation and one of $1^{st}$ to $M^{th}$ output control signals, and
wherein M is a positive integer greater than 1,
wherein the zeroth output control signal and the $1^{st}$ to $M^{th}$ output control signals are included in the output control signal, and
wherein the $1^{st}$ to $M^{th}$ internal ready/busy signals are included in the internal ready/busy signal.

* * * * *